United States Patent
Liu et al.

(10) Patent No.: US 12,161,028 B2
(45) Date of Patent: Dec. 3, 2024

(54) DISPLAY SUBSTRATE, MANUFACTURING METHOD AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tingliang Liu, Beijing (CN); Weiyun Huang, Beijing (CN); Xiangdan Dong, Beijing (CN); Yue Long, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 953 days.

(21) Appl. No.: 17/251,575

(22) PCT Filed: May 25, 2020

(86) PCT No.: PCT/CN2020/092017
§ 371 (c)(1),
(2) Date: Dec. 11, 2020

(87) PCT Pub. No.: WO2020/248804
PCT Pub. Date: Dec. 17, 2020

(65) Prior Publication Data
US 2021/0265452 A1    Aug. 26, 2021

(30) Foreign Application Priority Data
Jun. 14, 2019  (CN) .......................... 201910516045.7

(51) Int. Cl.
*H01L 33/00*     (2010.01)
*H10K 59/131*    (2023.01)
(Continued)

(52) U.S. Cl.
CPC ........... *H10K 59/131* (2023.02); *H10K 71/00* (2023.02); *H10K 59/1201* (2023.02)

(58) Field of Classification Search
None
See application file for complete search history.

(56) References Cited

U.S. PATENT DOCUMENTS

2012/0162053 A1  6/2012  Lee et al.
2012/0169699 A1  7/2012  Shin
(Continued)

FOREIGN PATENT DOCUMENTS

CN  102569675 A  7/2012
CN  104752439 A  7/2015
(Continued)

OTHER PUBLICATIONS

Office Action of CN Application No. 2019105160457 and English translation, dated Nov. 24, 2020, 10 pages.
(Continued)

*Primary Examiner* — Bradley Smith
(74) *Attorney, Agent, or Firm* — MUNCY, GEISSLER, OLDS & LOWE, P.C.

(57) ABSTRACT

The present disclosure provides a display substrate, a manufacturing method thereof, and a display device. The display substrate includes a first conductive pattern and a second conductive pattern arranged at different layers and electrically connected to each other via at least two conductive connection structures.

10 Claims, 3 Drawing Sheets

(51) Int. Cl.
    *H10K 71/00*        (2023.01)
    *H10K 59/12*        (2023.01)

(56)            References Cited

U.S. PATENT DOCUMENTS

2015/0001482 A1    1/2015   Jung
2015/0372150 A1*   12/2015  Kao .................. H01L 29/78624
                                                           257/43
2017/0338438 A1    11/2017  Kwon et al.
2019/0067398 A1*   2/2019   Liu ..................... H10K 59/805
2020/0266215 A1    8/2020   Dong et al.

FOREIGN PATENT DOCUMENTS

CN       106653819 A     5/2017
CN       107565049 A     1/2018
CN       108470749 A     8/2018
CN       109326612 A     2/2019
CN       110176481 A     8/2019

OTHER PUBLICATIONS

International Search Report of PCT/CN2020/092017 and English translation, dated Aug. 31, 2020, 15 pages.

* cited by examiner

DISPLAY SUBSTRATE, MANUFACTURING METHOD AND DISPLAY DEVICE

CROSS-REFERENCE TO RELATED APPLICATION

This application is the U.S. national phase of PCT Application No. PCT/CN2020/092017 filed on May 25, 2020, which claims priority to Chinese Patent Application No. 201910516045.7 filed on Jun. 14, 2019, the disclosures of which are incorporated in their entirety by reference herein.

TECHNICAL FIELD

The present disclosure relates to the field of display technology, in particular to a display substrate, a manufacturing method thereof, a display device.

BACKGROUND

Recently, Active-Matrix Organic Light-Emitting Diode (AMOLED) display devices have developed rapidly, and a display effect thereof is highly demanded. Main display deficiencies of the AMOLED display device lie in discolor, Long Range Uniformity (LRU), etc.

SUMMARY

In one aspect, the present disclosure provides in some embodiments a display substrate, including a first conductive pattern and a second conductive pattern arranged at different layers and electrically connected to each other via at least two conductive connection structures.

In a possible embodiment of the present disclosure, a passivation layer is arranged between the first conductive pattern and the second conductive pattern, and the at least two conductive connection structures include a first connection line passing through the passivation layer and in direct contact with the first conductive pattern and the second conductive pattern.

In a possible embodiment of the present disclosure, the at least two conductive connection structures include at least two first connection lines.

In a possible embodiment of the present disclosure, the display substrate further includes an insulation layer arranged at a side of the first conductive pattern away from the second conductive pattern, and an auxiliary conductive pattern arranged at a side of the insulation layer away from the first conductive pattern. The at least two conductive connection structures further include a second connection line including a first portion passing through the passivation layer and the insulation layer and a second portion passing through the insulation layer. The first portion is in direct contact with the second conductive pattern and the auxiliary conductive pattern, and the second portion is in direct contact with the first conductive pattern and the auxiliary conductive pattern.

In a possible embodiment of the present disclosure, the auxiliary conductive pattern is arranged at a same layer and made of a same material as a gate metal layer pattern of the display substrate, and/or the auxiliary conductive pattern is arranged at a same layer and made of a same material as a source electrode contact region of an active layer of the display substrate.

In a possible embodiment of the present disclosure, the display substrate is an Organic Light-Emitting Diode (OLED) display substrate, the first conductive pattern is a drain electrode of the display substrate, and the second conductive pattern is an anode of the display substrate.

In another aspect, the present disclosure provides in some embodiments a method for manufacturing a display substrate, including: forming a first conductive pattern and a second conductive pattern at different layers; and forming at least two conductive connection structures through which the first conductive pattern is electrically connected to the second conductive pattern.

In a possible embodiment of the present disclosure, a passivation layer is arranged between the first conductive pattern and the second conductive pattern, and the forming the at least two conductive connection structures includes forming a first connection line passing through the passivation layer and in direct contact with the first conductive pattern and the second conductive pattern.

In a possible embodiment of the present disclosure, the display substrate further includes an insulation layer arranged at a side of the first conductive pattern away from the second conductive pattern. The forming the at least two conductive connection structures includes forming an auxiliary conductive pattern at a side of the insulation layer away from the first conductive pattern, and forming a second connection line including a first portion passing through the passivation layer and the insulation layer and a second portion passing through the insulation layer. The first portion is in direct contact with the second conductive pattern and the auxiliary conductive pattern, and the second portion is in direct contact with the first conductive pattern and the auxiliary conductive pattern.

In a possible embodiment of the present disclosure, the forming the auxiliary conductive pattern includes: forming the auxiliary conductive pattern and a gate metal layer pattern of the display substrate through a single patterning process; and/or forming the auxiliary conductive pattern and a source electrode contact region of an active layer of the display substrate through a single patterning process.

In yet another aspect, the present disclosure provides in some embodiments a display device including the above-mentioned display substrate.

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 1:
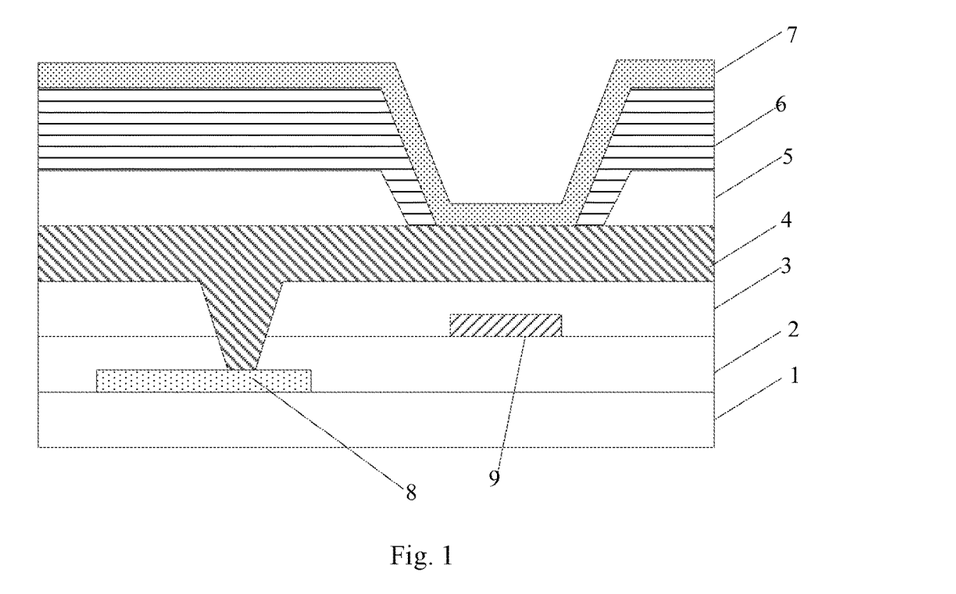
FIG. 1 is a schematic view showing a conventional display substrate.
Figure 2:
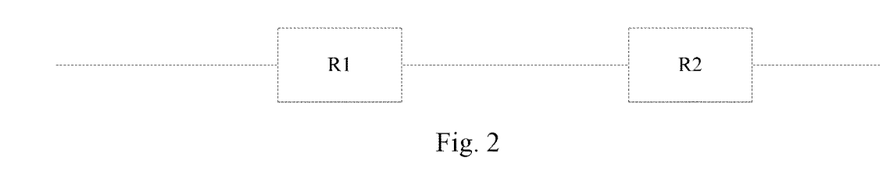
FIG. 2 is a schematic view showing equivalent resistance of the conventional display substrate.

In a current Thin Film Transistor (TFT) circuitry of an AMOLED display substrate, a source/drain metal layer pattern is of a Ti/Al/Ti laminated structure. Al is a metal with high activity, and it may easily be oxidized in a water-oxygen environment. In a manufacture process of the conventional AMOLED display substrate, after the formation of the source/drain metal layer pattern, as shown in FIG. 1, a passivation layer 5 is formed to cover a side surface of a drain electrode 4, so as to protect the drain electrode 4 and improve the reliability of a display product. However, the introduction of the passivation layer 5 leads to an increase in a connection resistance between the drain electrode 4 and an anode 7, as shown in FIG. 2, where R1 represents a resistance between an active layer 8 and the drain electrode 4, and R2 represents a resistance between the drain electrode 4 and the anode 7. After the introduction of the passivation layer 5, R2 will increase from 300Ω-400Ω to 500Ω-600Ω, resulting in serious problems such as discolor and LRU. Hence, a display effect of a display device may be adversely affected.

An object of the present disclosure is to provide a display substrate, a manufacturing method thereof and a display device, so as to reduce a connection resistance between the drain electrode and the anode, thereby to improve the display effect of the display device.

The present disclosure provides in some embodiments a display substrate, which includes a first conductive pattern and a second conductive pattern arranged at different layers and electrically connected to each other via at least two conductive connection structures.

According to the display substrate in the embodiments of the present disclosure, the first conductive pattern and the second conductive pattern arranged at different layers may be electrically connected to each other via the at least two conductive connection structures. As a result, it is able to reduce a connection resistance between the first conductive pattern and the second conductive pattern, and solve problems such as discolor and LRU for the display substrate, thereby to improve a display effect of a display device.

The first conductive pattern and the second conductive pattern may be any two conductive patterns which are arranged at different layers of the display substrate and which need to be electrically connected to each other, e.g., the first conductive pattern may be a drain electrode and the second conductive pattern may be a pixel electrode.

For example, when the display substrate is an OLED display substrate, the first conductive pattern may be a drain electrode of the display substrate and the second conductive pattern may be an anode of the display substrate.

In a possible embodiment of the present disclosure, a passivation layer may be arranged between the first conductive pattern and the second conductive pattern. The at least two conductive connection structures may include a first connection line passing through the passivation layer and in direct contact with the first conductive pattern and the second conductive pattern.

In a possible embodiment of the present disclosure, the at least two conductive connection structures may include at least two first connection lines. In this regard, the first conductive pattern and the second conductive pattern may be electrically connected to each other via the at least two first connection lines, and the at least two first connection lines may be connected in parallel to each other so as to reduce a connection resistance between the first conductive pattern and the second conductive pattern.

In another possible embodiment of the present disclosure, the display substrate may further include an insulation layer arranged at a side of the first conductive pattern away from the second conductive pattern, and an auxiliary conductive pattern arranged at a side of the insulation layer away from the first conductive pattern. The at least two conductive connection structures may further include a second connection, which includes a first portion passing through the passivation layer and the insulation layer and a second portion passing through the insulation layer. The first portion may be in direct contact with the second conductive pattern and the auxiliary conductive pattern, and the second portion may be in direct contact with the first conductive pattern and the auxiliary conductive pattern. In this regard, apart from the first connection line, the first conductive pattern and the second conductive pattern may also be electrically connected to each other via the second connection line. The first connection lien and the second connection line may be connected in parallel to each other, so as to reduce the connection resistance between the first conductive pattern and the second conductive pattern.

In a possible embodiment of the present disclosure, the auxiliary conductive pattern may be arranged at a same layer and made of a same material as a gate metal layer pattern of the display substrate. In this regard, the auxiliary conductive pattern and the gate metal layer pattern of the display substrate may be formed through a single patterning process, i.e., it is unnecessary to form the auxiliary conductive pattern through an additional patterning process, so it is able to reduce the quantity of patterning processes for the display substrate, thereby to reduce the manufacture cost of the display substrate. Alternatively, the auxiliary conductive pattern may also be arranged at a same layer and made of a same material as a source electrode contract region of an active layer of the display substrate. In this regard, the auxiliary conductive pattern and the source electrode contact region of the display substrate may be formed through a single patterning process, i.e., it is unnecessary to form the auxiliary conductive pattern through an additional patterning process, so it is able to reduce the quantity of patterning processes for the display substrate, thereby to reduce the manufacture cost of the display substrate.

The present disclosure further provides in some embodiments a method for manufacturing a display substrate, which includes: forming a first conductive pattern and a second conductive pattern at different layers; and forming at least two conductive connection structures through which the first conductive pattern is electrically connected to the second conductive pattern.

According to the embodiments of the present disclosure, the first conductive pattern and the second conductive pattern of the display substrate arranged at different layers may be electrically connected to each other via the at least two conductive connection structures. As a result, it is able to reduce a connection resistance between the first conductive pattern and the second conductive pattern, and solve such problems as discolor and LRU for the display substrate, thereby to improve a display effect of a display device.

The first conductive pattern and the second conductive pattern may be any two conductive patterns which are arranged at different layers of the display substrate and which need to be electrically connected to each other, e.g., the first conductive pattern may be a drain electrode and the second conductive pattern may be a pixel electrode.

For example, when the display substrate is an OLED display substrate, the first conductive pattern may be a drain electrode of the display substrate and the second conductive pattern may be an anode of the display substrate.

In a possible embodiment of the present disclosure, a passivation layer may be arranged between the first conductive pattern and the second conductive pattern. The forming the at least two conductive connection structures may include forming a first connection line passing through the passivation layer and in direct contact with the first conductive pattern and the second conductive pattern. In this regard, the first conductive pattern and the second conductive pattern may be electrically connected to each other via at least two first connection lines, and the at least two first connection lines may be connected in parallel to each other so as to reduce a connection resistance between the first conductive pattern and the second conductive pattern.

In a possible embodiment of the present disclosure, the display substrate may further include an insulation layer arranged at a side of the first conductive pattern away from the second conductive pattern. The forming the at least two conductive connection structures may include forming an auxiliary conductive pattern at a side of the insulation layer away from the first conductive pattern, and forming a second connection line including a first portion passing through the passivation layer and the insulation layer and a second portion passing through the insulation layer. The first portion may be in direct contact with the second conductive pattern and the auxiliary conductive pattern, and the second portion may be in direct contact with the first conductive pattern and the auxiliary conductive pattern. In this regard, apart from the first connection line, the first conductive pattern and the second conductive pattern may also be electrically connected to each other via the second connection line. The first connection lien and the second connection line may be connected in parallel to each other, so as to reduce the connection resistance between the first conductive pattern and the second conductive pattern.

In a possible embodiment of the present disclosure, the forming the auxiliary conductive pattern may include forming the auxiliary conductive pattern and a gate metal layer pattern of the display substrate through a single patterning process; and/or forming the auxiliary conductive pattern and a source electrode contact region of an active layer of the display substrate through a single patterning process. In this regard, it is unnecessary to form the auxiliary conductive pattern through an additional patterning process, so it is able to reduce the quantity of patterning processes for the display substrate, thereby to reduce the manufacture cost of the display substrate. Alternatively, the forming the auxiliary conductive pattern may include forming the auxiliary conductive pattern and a source electrode contact region of an active layer of the display substrate through a single patterning process. In this regard, it is unnecessary to form the auxiliary conductive pattern through an additional patterning process, so it is able to reduce the quantity of patterning processes for the display substrate, thereby to reduce the manufacture cost of the display substrate.

The present disclosure will be further described hereinafter in conjunction with the drawings and embodiments when the first conductive pattern is a drain electrode of the display substrate and the second conductive pattern is an anode of the display substrate.

Figure 5:
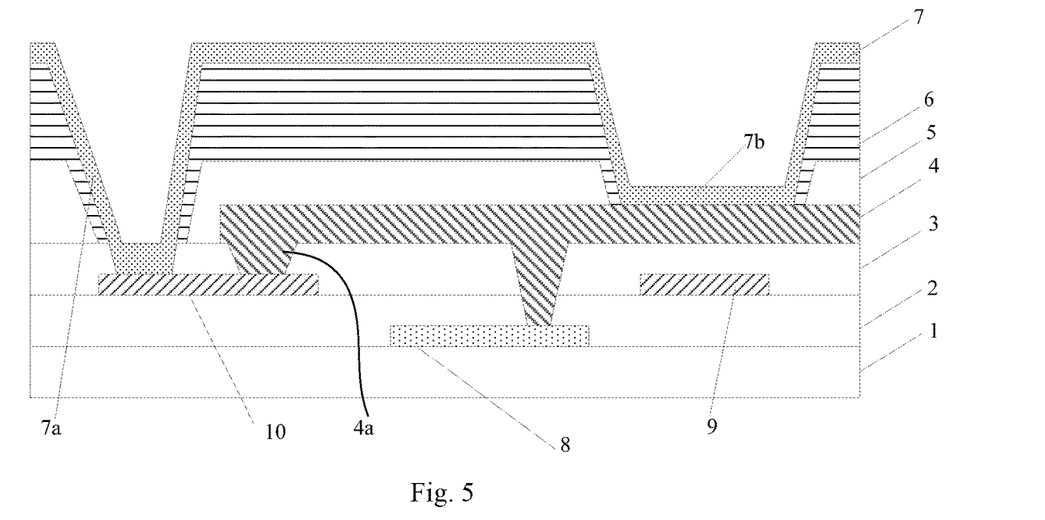
FIG. 5 is a schematic view showing the display substrate according to one embodiment of the present disclosure.

In some embodiments of the present disclosure, the auxiliary conductive pattern may be formed using a gate metal layer. The anode may be connected to the drain electrode via a first connection line 7b passing through the passivation layer (as shown in FIG. 5) and also via a second connection line. The second connection line may include a first portion 7a through which the auxiliary conductive pattern is connected to the anode (as shown in FIG. 5) and a second portion 4a through which the auxiliary conductive pattern is connected to the drain electrode (as shown in FIG. 5).

Figure 3:
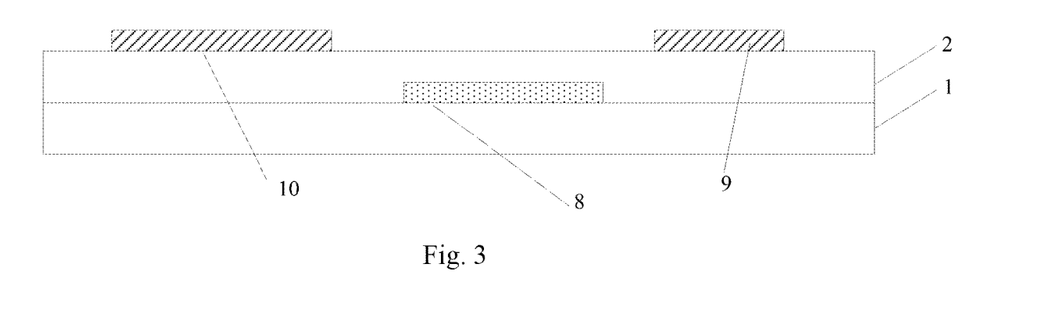
FIG. 3 is a schematic view showing a display device after the formation of a gate metal layer pattern according to one embodiment of the present disclosure.

As shown in FIG. 3, a base substrate 1 may be provided, and an active layer 8 and a first gate insulation layer 2 may be formed on the base substrate 1. In addition, an auxiliary conductive pattern 10 and a gate metal layer pattern 9 may be formed on the first gate insulation layer 2 through a single patterning process. The base substrate 1 may be a rigid substrate or a flexible substrate.

Figure 4:
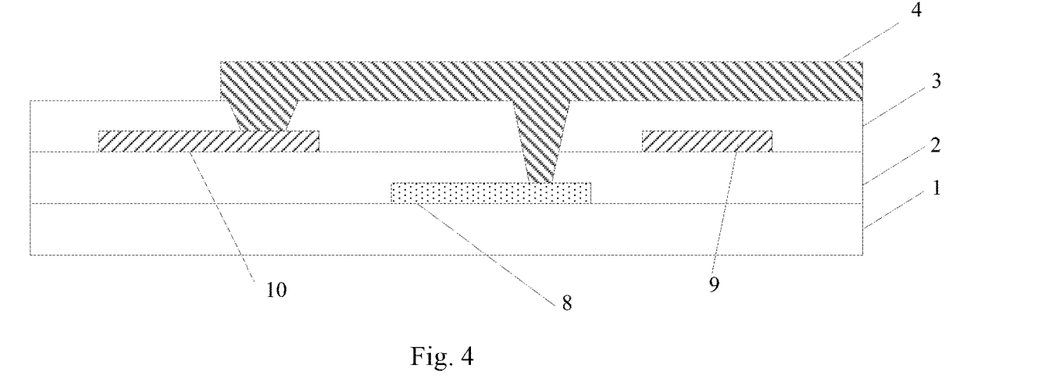
FIG. 4 is a schematic view showing the display device after the formation of a source/drain metal layer pattern according to one embodiment of the present disclosure.

As shown in FIG. 4, a second gate insulation layer 3 may be formed. The second gate insulation layer 3 and the first gate insulation layer 2 may be patterned to form a via-hole for exposing the active layer 8 and a via-hole for exposing the auxiliary conductive pattern 10. In addition, a drain electrode 4 may be formed on the second gate insulation layer 3, connected to the active layer 8 through the via-hole passing through the first gate insulation layer 2 and the second gate insulation layer 3, and connected to the auxiliary conductive pattern 10 through the via-hole passing through the second gate insulation layer 3. In addition, the via-hole passing through the second gate insulation layer 3 may also be reserved above the auxiliary conductive pattern 10.

As shown in FIG. 5, a passivation layer 5 and a planarization layer 6 may be formed and patterned, and an anode 7 may be formed on the planarization layer 6. The anode 7 may be connected to the drain electrode 4 through a via-hole passing through the planarization layer 6 and the passivation layer 5, and connected to the auxiliary conductive pattern 10 through a via-hole passing through the second gate insulation layer 3, the planarization layer 6 and the passivation layer 5.

In the embodiments of the present disclosure, the anode 7 may be directly connected to the drain electrode 4 through the via-hole passing through the planarization layer 6 and the passivation layer 5, and also through the auxiliary conductive pattern 10.

Figure 6:
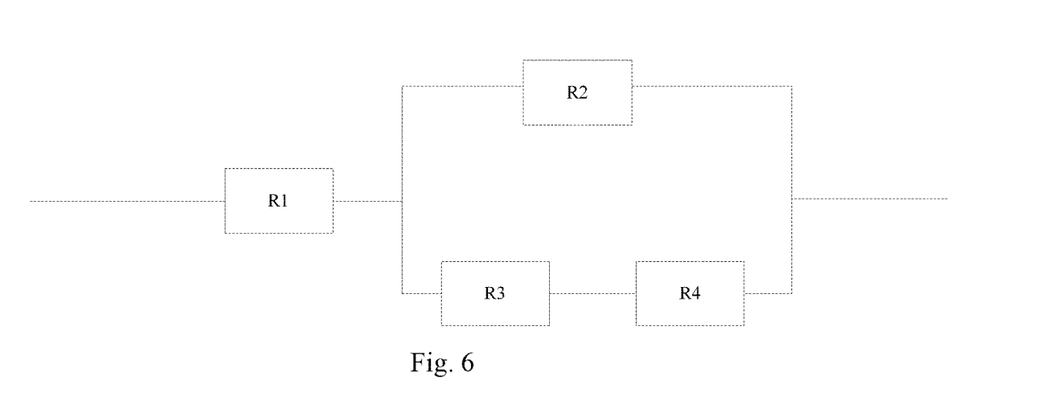
FIG. 6 is a schematic view showing equivalent resistance of the display substrate in FIG. 5.

As shown in FIG. 6, R1 represents a resistance between the active layer 8 and the drain electrode 4, R2 represents a resistance between the drain electrode 4 and the anode 7, R3 represents a resistance between the drain electrode 4 and the auxiliary conductive pattern 10, and R4 represents a resistance between the anode 7 and the auxiliary conductive pattern 10. As compared with FIG. 2, a connection resistance between the active layer 8 and the anode 7 may change from R1+R2 in FIG. 2 to R1+R2*(R3+R4)/(R2+R3+R4). R2'=(R3+R4)/(R2+R3+R4)<1, so R1+R2'<R1+R2. It can be seen that, according to the scheme in the embodiments of the present disclosure, it is able to reduce the connection resistance between the drain electrode 4 and the anode 7 on the basis of FIG. 2, thereby to improve the display effect of the display device.

Figure 7:
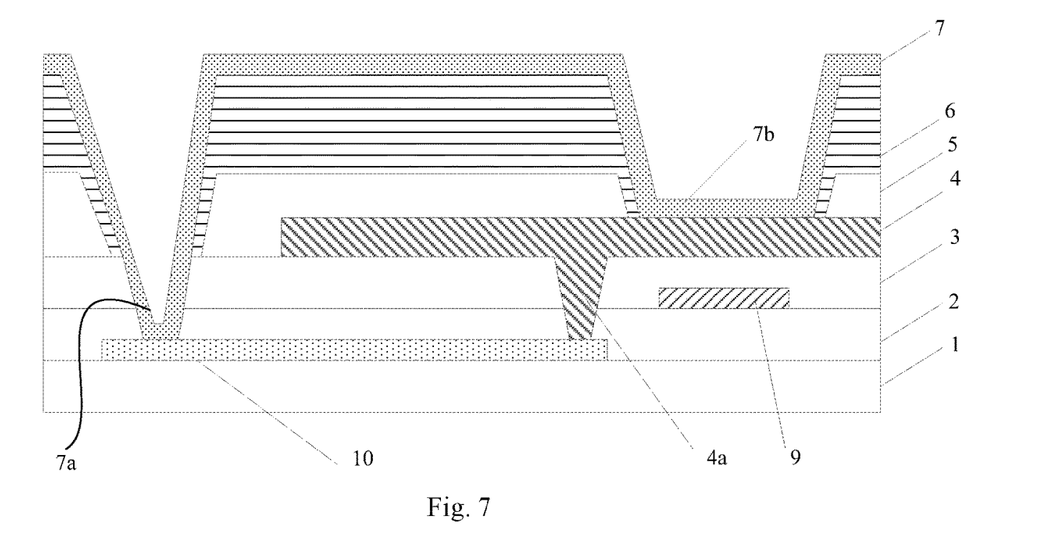
FIG. 7 is another schematic view showing the display substrate according to one embodiment of the present disclosure.

In some embodiments of the present disclosure, the auxiliary conductive pattern may be formed through a doped active layer, e.g., a source electrode contact region. The anode may be connected to the drain electrode through the first connection line 7b passing through the passivation layer (as shown in FIG. 7), and also through the second connection line. The second connection line may include the first portion 7a through which the auxiliary conductive pattern is connected to the anode (as shown in FIG. 7) and the second portion 4a through which the auxiliary conductive pattern is connected to the drain electrode (as shown in FIG. 7).

As shown in FIG. 7, a base substrate 1 may be provided. An active layer may be formed on the base substrate 1, and a part of the active layer may be doped to form the auxiliary conductive pattern 10. A first gate insulation layer 2 may be formed, and a gate metal layer pattern 9 may be formed on the first gate insulation layer 2. The base substrate 1 may be a rigid substrate or a flexible substrate.

A second gate insulation layer 3 may be formed. The second gate insulation layer 3 and the first gate insulation layer 2 may be patterned, so as to form a via-hole for exposing the auxiliary conductive pattern 10. A drain electrode 4 may be formed on the gate insulation layer 3, and connected to the auxiliary conductive pattern 10 through the via-hole passing through the first gate insulation layer 2 and the second gate insulation layer 3. In addition, the via-hole passing through the first gate insulation layer 2 and the second gate insulation layer 3 may also be reserved above the auxiliary conductive pattern 10.

A passivation layer 5 and a planarization layer 6 may be formed and patterned, and an anode 7 may be formed on the planarization layer 6. The anode 7 may be connected to the drain electrode 4 through a via-hole passing through the planarization layer 6 and the passivation layer 5, and also connected to the auxiliary conductive pattern 10 through a via-hole hole passing through the first gate insulation layer 2, the second gate insulation layer 3, the planarization layer 6 and the passivation layer 5.

In the embodiments of the present disclosure, the anode 7 may be directly connected to the drain electrode 4 through the via-hole passing through the planarization layer 6 and the passivation layer 5, and also through the auxiliary conductive pattern 10.

Figure 8:
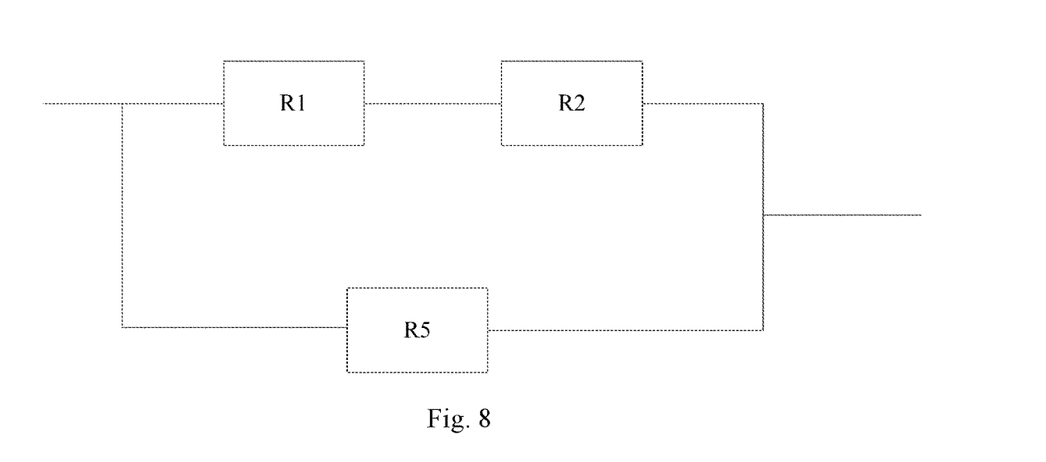
FIG. 8 is a schematic view showing equivalent resistance of the display substrate in FIG. 7.

As shown in FIG. 8, R1 represents a resistance between the active layer and the drain electrode 4, R2 represents a resistance between the drain electrode 4 and the anode 7, and R5 represents a resistance between the auxiliary conductive pattern 10 and the anode 7. As compared with FIG. 2, a connection resistance between the active layer and the anode 7 may change from R1+R2 in FIG. 2 to (R1+R2)*R5/(R1+R2+R5). It can be seen that, according to the scheme in the embodiments of the present disclosure, it is able to reduce the connection resistance between the drain electrode 4 and the anode 7 on the basis of FIG. 2, thereby to improve the display effect of the display device.

In addition, in the embodiments of the present disclosure, apart from using the gate metal layer and the source electrode contact region of the active layer, the auxiliary conductive pattern 10 may also be formed using a source/drain metal layer. For example, a size of the drain electrode 4 may be increased, and a plurality of via-holes passing through the passivation layer 5 and the planarization layer 6 may be formed above the drain electrode 4. The anode 7 may be connected to the drain electrode 4 through the plurality of via-holes, so as to reduce the connection resistance between the anode 7 and the drain electrode 4.

The present disclosure further provides in some embodiments a display device including the above-mentioned display substrate. The display device may include, but not limited to, a radio frequency unit, a network module, an audio output unit, an input unit, a sensor, a display unit, a user input unit, an interface unit, a memory, a processor, and a power source. It should be appreciated that, the display device may not be limited thereto, i.e., it may include more or fewer members, or some members may be combined, or the members may be arranged in different modes. In the embodiments of the present disclosure, the display device may include, but not limited to, display, mobile phone, flat-panel computer, television, wearable electronic device or navigator.

The display device may be any product or member having a display function, e.g., television, display, digital photo frame, mobile phone or flat-panel computer. The display device may further include a flexible circuit board, a printed circuit board and a back plate.

It should be appreciated that, the above embodiments have been described in a progressive manner, and the same or similar contents in the embodiments have not been repeated, i.e., each embodiment has merely focused on the difference from the others. Especially, the product embodiments may be substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a first conductive pattern, a second conductive pattern arranged at a layer different from the first conductive pattern, and at least two conductive connection structures, wherein each of the at least two conductive connection structures is electrically connected to the first conductive pattern and the second conductive pattern, wherein the first conductive pattern is a drain electrode of an Organic Light-Emitting Diode (OLED) display substrate, and the second conductive pattern is an anode of the OLED display substrate, wherein the display substrate further comprises a passivation layer arranged between the first conductive pattern and the second conductive pattern, wherein the at least two conductive connection structures comprise a first connection line passing through the passivation layer and in direct contact with the first conductive pattern and the second conductive pattern, and wherein the display substrate further comprises an insulation layer arranged at a side of the first conductive pattern away from the second conductive pattern, and an auxiliary conductive pattern arranged at a side of the insulation layer away from the first conductive pattern, wherein the at least two conductive connection structures further comprise a second connection line comprising a first portion passing through the passivation layer and the insulation layer and a second portion passing through the insulation layer, wherein the first portion is in direct contact with the second conductive pattern and the auxiliary conductive pattern, and the second portion is in direct contact with the first conductive pattern and the auxiliary conductive pattern.

2. The display substrate according to claim 1, wherein the at least two conductive connection structures comprise at least two first connection lines.

3. The display substrate according to claim 1, wherein the first connection line extends from the second conductive pattern to the first conductive pattern.

4. The display substrate according to claim 1, wherein the auxiliary conductive pattern is arranged at a same layer and made of a same material as a gate metal layer pattern of the display substrate.

5. The display substrate according to claim 1, wherein the auxiliary conductive pattern is arranged at a same layer and made of a same material as a source electrode contact region of an active layer of the display substrate.

6. The display substrate according to claim 1, wherein the first portion extends from the second conductive pattern to the auxiliary conductive pattern, and the second portion extends from the first conductive pattern to the auxiliary conductive pattern.

7. The display substrate according to claim 6, wherein the first connection line extends from the second conductive pattern to the first conductive pattern.

8. A display device, comprising the display substrate according to claim 1.

9. A method for manufacturing a display substrate, comprising: forming a first conductive pattern and a second conductive pattern at different layers; and forming at least two conductive connection structures through which the first conductive pattern is electrically connected to the second conductive pattern, wherein the first conductive pattern is a drain electrode of an Organic Light-Emitting Diode (OLED) display substrate, and the second conductive pattern is an anode of the OLED display substrate, wherein a passivation layer is arranged between the first conductive pattern and the second conductive pattern, and the forming the at least two conductive connection structures through which the first conductive pattern is electrically connected to the second conductive pattern comprises: forming a first connection line passing through the passivation layer and in direct contact with the first conductive pattern and the second conductive pattern, and wherein the display substrate further comprises an insulation layer arranged at a side of the first conductive pattern away from the second conductive pattern, wherein the forming the at least two conductive connection structures through which the first conductive pattern is electrically connected to the second conductive pattern comprises: forming an auxiliary conductive pattern at a side of the insulation layer away from the first conductive pattern, and forming a second connection line comprising a first portion passing through the passivation layer and the insulation layer and a second portion passing through the insulation layer, wherein the first portion is in direct contact with the second conductive pattern and the auxiliary conductive pattern, and the second portion is in direct contact with the first conductive pattern and the auxiliary conductive pattern.

10. The method according to claim 9, wherein the forming the auxiliary conductive pattern at a side of the insulation layer away from the first conductive pattern comprises:

forming the auxiliary conductive pattern and a gate metal layer pattern of the display substrate through a single patterning process; and/or forming the auxiliary conductive pattern and a source electrode contact region of an active layer of the display substrate through a single patterning process.

* * * * *

UNITED STATES PATENT AND TRADEMARK OFFICE
CERTIFICATE OF CORRECTION

| | | |
|---|---|---|
| PATENT NO. | : 12,161,028 B2 | Page 1 of 1 |
| APPLICATION NO. | : 17/251575 | |
| DATED | : December 3, 2024 | |
| INVENTOR(S) | : Tingliang Liu | |

It is certified that error appears in the above-identified patent and that said Letters Patent is hereby corrected as shown below:

On the Title Page

Item (73) Delete "CHENGDU BOE OPTOELECTRONICS TECHNOLOGY CO., LTD., Sichuan (CN); BOE TECHNOLOGY GROUP CO., LTD. , Beijing (CN)"

Insert -- BEIJING BOE TECHNOLOGY DEVELOPMENT CO., LTD., Beijing (CN); CHENGDU BOE OPTOELECTRONICS TECHNOLOGY CO., LTD., Sichuan (CN) --

Signed and Sealed this
First Day of July, 2025

Coke Morgan Stewart
*Acting Director of the United States Patent and Trademark Office*